United States Patent [19]

Kelly

[11] 4,191,164

[45] Mar. 4, 1980

[54] DUAL CONVERSION STEAM AND ELECTRIC SOLAR POWER SYSTEM

[76] Inventor: Donald A. Kelly, 58-06 69th Pl., Maspeth, New York, N.Y. 11378

[21] Appl. No.: 734,028

[22] Filed: Oct. 20, 1976

[51] Int. Cl.² ............................................. F24J 3/02
[52] U.S. Cl. ..................................... 126/439; 60/641; 126/440; 136/89 PC
[58] Field of Search ............... 126/270, 271; 237/1 A; 60/641

[56] References Cited

U.S. PATENT DOCUMENTS

| | | | |
|---|---|---|---|
| 895,761 | 8/1908 | Huntoon | 126/271 |
| 1,683,266 | 9/1928 | Shipman | 126/271 |
| 3,217,702 | 11/1965 | Miller | 126/270 |
| 3,868,823 | 3/1975 | Russell, Jr. et al. | 126/271 X |
| 3,903,699 | 9/1975 | Davis | 126/271 X |
| 3,976,508 | 8/1976 | Mlavsky | 126/271 X |

*Primary Examiner*—Samuel Scott
*Assistant Examiner*—Larry Jones

[57] ABSTRACT

The dual conversion, steam and electric solar power system is aimed at attaining an optimum cost/effective balance between arrays of direct electric conversion solar cells, and an indirect steam-to-electric solar power system.

The concentration panels for the system consist of the previously disclosed four quadrant, two dimensional type of concentration panel with higher side concave extensions to provide concentration ratios up to 35:1.

A continuous flash boiler pipe serves as the base conversion means, with a box-form array of solar cells mounted at the cold water entrance end of the pipe(s). The entering cold water dissipates heat from the solar cells while pre-heating the water for the subsequent section of the flash boiler pipe exposed section.

The solar panel width to focal zone width is between 22:1 and 28:1.

10 Claims, 6 Drawing Figures

DUAL CONVERSION STEAM AND ELECTRIC SOLAR POWER SYSTEM

BACKGROUND OF THE INVENTION

The dual conversion, four quadrant, linear solar concentration panel concept has been adopted to provide two dimension, or all around solar ray concentration on a three dimensional focal zone, rather than on a single focal line, as with a conventional parabolic linear reflector, with only two lower solar exposure quadrants.

The previously disclosed four quadrant, two dimensional linear concentration panels defined the geometric proportions and parameters, along with the total concentration ratio from all three reflective sections and one top row of linear convex lenses.

The prior solar panel's proportions were based on an assumed ideal panel width of 18", which is believed to be about the maximum width that can readily controlled during continuous oscillations, and resist damage from high wind and storm loads. It is possible that wider panels are practical, but the weight must be kept to a minimum consistant with structural rigidity and strength.

The key factor in the value of these latest solar panels is that solar concentration is provided in all four quadrnats of the focal zone, so that compact solar ray convergence is achieved with a high total concentration ratio. The classic type of linear parabolic reflector panel, used to heat water into steam was a shallow height, low ratio-(about 5:1) configuration.

The conventional parabolic reflectors provided solar ray concentration in less than two lower quadrants at the focal line, plus only one-sun exposure from the top, which necessitates the use of a very long pipe line in order to flash the hot water over to steam.

Some recent sun-tracking solar concentration panels provide only solar concentration from the top linear lens surface which, at best, provides a continuous heat transfer onto the top half of a focal line pipe. Aside from the heating loss at the unheated pipe underside, inordinate stresses are induced in the full pipe cross-section, with the top half expanding at a greater rate than the bottom half in the linear direction.

This latest type of high ratio deep contour linear concentrator panel is ideally matched to a combined steam flash boiler piping system, and localized square-form array of solar cells, because a cost/effective balance can be achieved—between the two methods which can result in the lowest possible cost-per-watt power output for home-sized power installations.

Although originally designed for use with central flash boiler pipes for a mechanical-to-electrical solar conversion system, the deep contoured, four quadrant solar panels are attractive for use with photovoltaic solar cells, when these are arrayed along, and in contact with, the flash boiler pipe, to produce a combined high density electrical power output, within a practical solar exposed total surface area.

The key point in the application of commercial silicon photovoltaic cells is that the optimum solar concentration ratio should be utilized, so that the highest possible wattage-to-cost output can be realized. Even though the linear watts-to concentration ratio is exceeded and lower proportional current is produced as the solar exposure increases, this inordinate current increase can be worthwhile for the system. Any disproportionate current increase can be cost-effective up to a high concentration ratio because the cost of the basic solar concentration panel is relatively inexpensive,—compared to current silicon photovoltaic solar cells.

When the arrays of solar cells are used with a central flash boiler pipe, the solar cells must be densely placed at the cold water entrance end of the panels, so that a cooling means is provided for the cells. The heat dissipated from the solar cells will provide the water preheating required for the later steam flashover near the exit end of the panels.

Essentially the combined solar cells and flash boiler piping solar conversion system requires that the multiple solar ar cells be located at the input cool water panel end for cooling purposes, and the flash boiler pipes exposed to high solar concentration for most of the piping length, and at the exit end of the panels, in a mutually compatible arrangement.

Although it may appear to be more logical to utilize increasing larger widths of full parabolic reflectors for corresponding larger solar concentration ratios, coupled with a small size of steam boiler pipe, there are several reasons for adopting a deep contour, four-quadrant concentration panel configuration place of the standard parabolic reflective section.

The key point against the linear parabolic reflective cross-section is there is an excessive lateral area solar collection loss because the section focal line is in line with the panel lateral lines, so that highly desirable solar concentration above the focal line is lost.

Another reason against the basic parabolic section is that it does not have the best possible structural section modulus when used for an elongate solar concentration panel.

A third, and final point against the basic parabolic cross-section is that the converging solar rays are focused on a thin line, rather than on a vertical plane surface, as represented by a flash boiler pipe, or line of solar cells at the focal zone. Additional equal and opposite concave side reflective extensions are necessary to provide uniform solar ray convergence on the second (height) dimension, as in the case of the present four quadrant, two dimensional solar concentration panels.

A major consideration in the application of any type of solar concentration panel is that the vertical centerline must always be kept in line with the normal solar rays, at any given time. The solar rays must fall normal to the horizontal axis of the panels, so that symmetrical, uniform solar ray distribution is maintained. These present solar concentration panels must track the sun within about one degree so that no inordinate dropoff in temperature and illumination occurs at the linear focal zone.

The linear solar concentrator panels are made of built-up fiber-glass-epoxy resin, on accurate cross-section forms. The panels are reinforced with longitudinal ribs and stringers, along with uniformly spaced cross partitions which also support the top linear lens sections and focal zone components.

The solar panels may be made up to about thirty feet in length, maximum, and may be fabricated in shorter five foot lengths which are joined together with formed metal slip-joint connectors to provide the total panel lengths required for each specific installation.

Each reflective concave surface of the panels must be fully mirrored, or have identical narrow mirror segments uniformly bonded to the continuous concave surface.

There are several differences between these and previous panel designs, the most significant being the higher side reflective extensions to increase the concentration ratio. Additionally, two equal and opposite lower reflective curved strips are located adjacent to the panel centerline, along with elongate slots on the centerline between each cross partition. The slots serve as rain drainage wind load relief means. so that somewhat wider solar panels are made possible.

This latest type of solar conversion power system is aimed at utilizing the operating features of both a flash boiler piping arrangement and series of solar photovoltaic cells to their best natural advantage, in a combined system to obtain the highest cost-effectiveness conversion possible on a final installation cost-per-watt output basis.

SUMMARY OF THE INVENTION

The dual conversion, steam and electric solar power system is advocated as a way of combining the best operating characteristics of an indirect, mechanical-to-electrical conversion means and a direct solar cell method in a composite natural energy system.

The power system consists of applying high concentration linear solar panels arranged in parallel arrays, with a flash boiler pipe located at the lower central focal zone for the all around heating effect at this zone.

Since cold water will enter at one end of the flash boiler pipes, a square-form array of silicon solar cells is placed directly over the piping at the cold entrance section. The entering cold water will pickup heat flow from each of the solar cells, so that a dual function is served as heat is dissipated from the solar cells, and this warmed water becomes preheated for remaining fully solar exposed flash boiler pipes.

A shortcoming of this series, dual conversion arrangement is that a long piping lengths are required, but an advantage is that the linear solar panels can pivot on the flash boiler pipe without a complicated water steam transfer connection.

The length of the exposed flash boiler pipe within each linear solar panel can be doubled, by using a bi-focal solar concentrator which can reduce the number of panels within a solar conversion installation. The main problem with the bi-focal panel design is that the solar panels can only pivot at one linear axis, and therefore a flexible fluid connection is required for the second pipe axis. A serious deficiency of the bi-focal solar concentration panel is that the solar ray concentration must be divided and shared by both focal zones, so that each receives about one-half of the total solar concentration. The shared total concentration ratio for both focal zones will result in additional linear solar panels to maintain a corresponding power level to that of a single focal zone linear panel.

When the single and double focal zone solar panels are compared, the overall advantages of the bi-focal concept are doubtful, except in the case where larger panel widths are considered safe and controllable. It is believed that the simplicity and maximum concentration ratio feature of the single focal zone linear solar panel makes it the first choice for most solar conversion installations.

The high concentration ratio solar panels used for this dual conversion steam and electric solar power system are improved versions of the previous four quadrant, two dimensional linear solar panel configuration. The two equal and opposite side concave reflective sections are projected higher and limited by specific width to height ratios. The maximum possible width to focal line ratio would be 1.32:1. The optimum width to focal line ratio would be 1.61:1, and finally the most practical panel width to focal line ratio would be 1.98:1.

The first two panel cross-section proportions are considered impractical, since the upper panel cross-section slope is too steep so that they do not receive a wide enough band of normal solar rays. A further point against inordinately high panel extensions is that they make the panel more difficult to oscillate and control in high winds.

The ideal practical solar panel cross-section has a 3:1, ratio for the centerline height distance between the focal line to panel top, and focal line to the panel bottom point (line) which can be readily controlled during continuous oscillations.

The panel width to height ratio must be between 1.83:1, and 1.46:1.

The linear solar panel cross-section shape geometry consists of specific combinations of geometric curves as follows:

The base cross-section is a parabola which is symmetrical about the basic panel vertical centerline, which is blended into two equal and opposite radial curves with the following proportions:

The radius for each equal and opposite concave curve is 0.971 times the panel width, with the radaii centered on a line which is 0.671 above the focal line, in the cross-section view.

A tolerance of plus or minus 0.07 is applied to each of the above proportionate dimensions.

Each of the upper concave reflective extensions will cause a series of bounce reflections-(about three) which are close to the basic concave surfaces. These close series of solar ray reflections from the upper panel extensions must be finally reflected up onto the central lower focal zone, by means of two short height curved reflector strips adjacent to the bottom center of the panel.

A series of top linear lens sections must be added to the panel centerline directly above the focal zone, to complete the all around solar ray concentration. While the focal distance for the top linear lenses is not critical, the width of the lens sections must be limited and balanced between a useful concentration ratio and the necessity of not blocking out excessive solar ray exposure of the lower parabolic reflective section.

The top linear lens sections should not exceed 8 times the width of the focal zone, for a 8:1 linear lens concentration ratio, nor be less than four times the focal zone width, for a 4:1 linear lens concentration ratio.

While the 5:1 maximum concentration ratio from the top lenses may not be high enough for balanced all-around concentration, it must be realized that additional solar ray convergence at the top quadrant of the focal zone can be obtained from both side concave reflective sections.

The total all around concentration ratio for the dual conversion linear solar panel will be between 30:1 and 35:1. The linear concentration panel has a panel width to focal zone width of between 22:1 and 28:1.

These linear solar panels should always be designed to the maximum proportions, since this will allow a minimum number of panels for a given installation and therefore the lowest costs for the system. The foregoing proportions for the linear solar panels define the ideal cross-section geometry and limits of the section configuration.

Coincident lines will occur between three quadrants of the linear solar panel, since the lower and two side panel sections are connected and continuous, while the top linear lens sections for the upper quadrant are discontinuous from the other three quadrants.

While there will be solar ray convergence gaps on either side of the top linear lens sections, there will be complete solar ray coincident convergence or overlap at the focal zone.

This latest type of linear solar concentration panel has been evolved to provide the highest all around solar concentration on a single three dimensional focal zone, and the resulting deep contour panel cross-section will be structurally rigid with a sound section modulus.

The linear solar concentration panels must not be made excessively wide, (wider than about 18"), because of the problems of keeping the oscillating panels stable and uneffected by high winds and storms. It is important that the solar panels be as light in weight as is practical, for ease of installation and replacement, and to make the sun-following drive mechanism easy to operate with a minimum of take-off power required.

The lightweight requirement for the solar panels makes the use of diherglass-apoxy resin construction a first choice, since this material when combined is tough, weather-resistant and can be readily formed over accurate molds.

Since the solar panels must be made with thin wall sections to keep the weight down, the use of uniformly spaced cross partitions, longitudinal ribs and stringers becomes necessary to maintain overall panel rigidity and strength. Torsional stiffness is also necessary for the panels, to maintain correct normal lineup with the solar rays within the angular tolerance during sun tracking oscillations of all the panels.

The temperature of the flash boiler size must be within the 250 degree to 300 degree range in order to flash the internally flowing water into steam. It is important that all-around uniform heating is realized at the flash boiler pipe so that the expansion and internal stresses within the pipe sections are uniform for normal pipe life expectancy.

The flash boiler pipe should be between $\frac{1}{4}"$ I.D. and $\frac{3}{4}"$ I.D., with 1" I.D. being about the maximum size for the largest width of solar panels. For the best heat transfer effectiveness, brass pipe should always be used for the boiler piping, with a black oxide outside coating applied to draw in the concentrated solar heat from the converging solar rays.

It is believed that the most effective solar power conversion installations will consist of many minimum-$\frac{1}{4}"$ I.D. flash boiler pipes combined with maximum ratio linear solar concentrator panels. Although more piping runs will probably be required for a given steam flow rate, all of these piping runs can be shorter, so that a minimum total solar exposure surface area will be necessary.

While the linear solar panels may be made up to thirty feet long, or possibly longer, for some installations, the individual panel sections may be fabricated in short five foot lengths for manufacturing convenience. These shorter lengths would be joined with formed metal slip on connectors to produce the final panel lengths for each specific solar power installation.

The solar panels are molded of several layers of diherglass-epoxy resin, on accurate, uniform linear forms, with highly reflective mirror surfaces bonded to the inside continuous concave cavity. Very narrow, identical mirror segments may be used in place of the continuous mirror surface, but these must be made in narrow, elongate strips to preserve the uniformity of the converging solar rays, and to keep fabrication time and labor within reason.

Each specific house type, style and roof surface area will dictate the placement of the various solar conversion componets, which may be split up into different rooftop zones, as necessary, or placed on special raised structures, such as patio covers, porch shades, and similar areas where shading may be desirable. The splitting up of some of the system components is not desirable, because of the piping friction losses entailed, but may be necessary to provide the total solar exposed surface area necessary for proper operation of the system.

It is projected that this dual solar conversion system using the deep contour solar concentrator panels will require about 750 square feet of fully exposed solar area. It is possible that less exposed solar surface area will be required as solar cell performance is improved along with some improvements made in the deep contour, linear solar panels.

The assembled linear solar panels are mounted directly onto the flash boiler pipes, by means of formed wire pivot loops, so that each panel may oscillate to follow the sun's travel during each day, and return to the next day's reset position during the night.

The flash boiler piping may be preassembled on lightweight frames to save rooftop installation time and labor. Sealed coupling connections would be made to the intake cold water line, and outlet stream line to the steam engine. All of the flash boiler pipes will be connected to the cold, or warmed water header, at one panel pivoting end, and to a steamheader at the opposite panel pivoting end, so that any number of piping runs may be conveniently connected to each opposite header unit.

It is probable that a water warming solar collector tank may be necessary, in order to reduce the length and number of solar panels and piping required for the system. The water warming tank will be an optical component for the system and its use will depend on the total solar exposure area available for each specific solar conversion installation.

The warmed water will still be effective for transferring excess heat from the four linear rows of solar cells directly on the flash boiler pipe, and will be more effective as a steam accelerating means for the remainder of the flash boiler piping, so that less heat input flow is required to flash the warmed water over to steam.

The assembled solar panels should have a slightly southerly slope for optimum solar exposure, but this slope must not be too great, since this would impose an excessive water pumping load on the system's water circulating pumps.

The pivoting axis of the solar panels must generally be inline with the north-south direction, so that all of the solar panels oscillate in an east-to-west direction during the day, and then return to the next day's reset position during the night. The sun-tracking mechanism necessary to keep the solar panels following the sun's relative travel will not be described in these specifications because this has been described in previous solar system specifications.

A complete solar conversion installation consists of the described high concentration solar panels, in multiple parallel rows, with both flash boiler piping and solar cell arrays arranged in series at the central focal zone. A water supply source is connected to the inlet header pipe, and an optional water warming tank may be included between the cold water supply line and the inlet header pipe.

The outlet side of the flash boiler pipes are connected to the steam header pipe which supplies the steam flow to the simple rotary steam engine. The rotary steam engine is directly coupled to a 110 V.A.C. alternator to provide the supplementary house power. The electrical power from the multiple array solar cells may be converted into A.C. power for various household appliances, or used as D.C. for resistance heaters, lights, or for thermoelectric coolers.

The sun-tracking mechanism which oscillates all of the solar panels simultaneously, may be electrically driven by a small D.C. motor, or by a spring motor, or by a gravity weight-escapement device, which has been described elsewhere.

All of the solar photovoltaic cells are arranged in a square-form pattern around the top, bottom, and sides and of the flash boiler pipes, to take advantage of the all around solar concentration (illumination) from the deep contour, four quadrant, linear solar panels.

An alternate arrangement for the dual conversion solar power system would be the application of the bi-focal type of solar panel design. In the bi-focal arangement, the flash boiler pipe makes a double pass through the panel's vertical center plane, so that double, but shared, solar concentration is achieved at the two focal zones.

The bi-focal solar panel concept would be applicable to installations where much wider panels could be safely used, since the high concentration ratio-(up to 35:1) could still be applied at each focal zone. The wider panels may allow a smaller total solar explosure area, where such space saving is necessary.

It is a principal object of the invention to establish a cost-effective solar energy conversion system which utilizes both direct electric solar cells, and indirect steam-to-electric conversion means for nearly full housepower requirements, where solar exposure is prevalent.

It is a further object of the invention to provide an economical power conversion means utilizing simple and replaceable, low-cost components which function with a high degree or reliability.

Other objectives and means for the invention have been described in previous disclosure and specifications. It should be understood that changes and variations may be made in the detail design of the dual conversion, steam and electric solar power system, without departing from the spirit and scope of the invention, as specified herein.

Several Disclosure Documents have been filed as prior, informal descriptions of this present solar power system, which are: (1) Deep Concave, Four-Quadrant, Linear Solar Concentration Panels. (2) High Density, Linear, Bi-Focal Solar Concentration Panels.

DESCRIPTION OF THE PREFERRED EMBODIMENT

Figure 1:
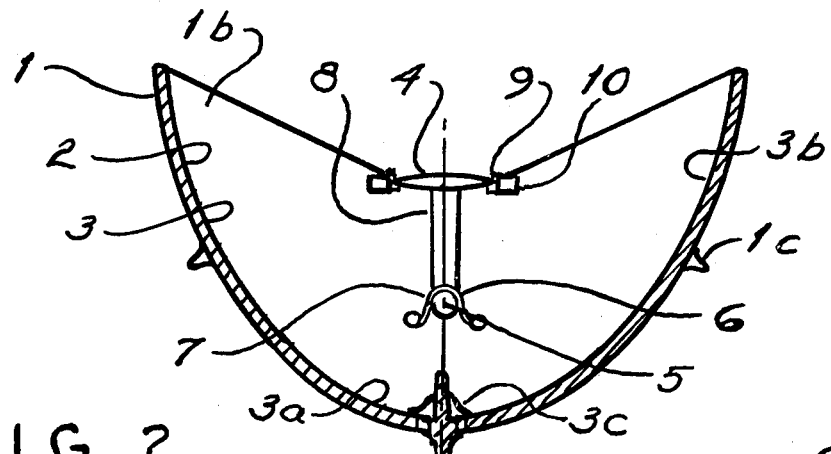
FIG. 1 is a cross-section view through the linear solar concentration panel.
Figure 2:
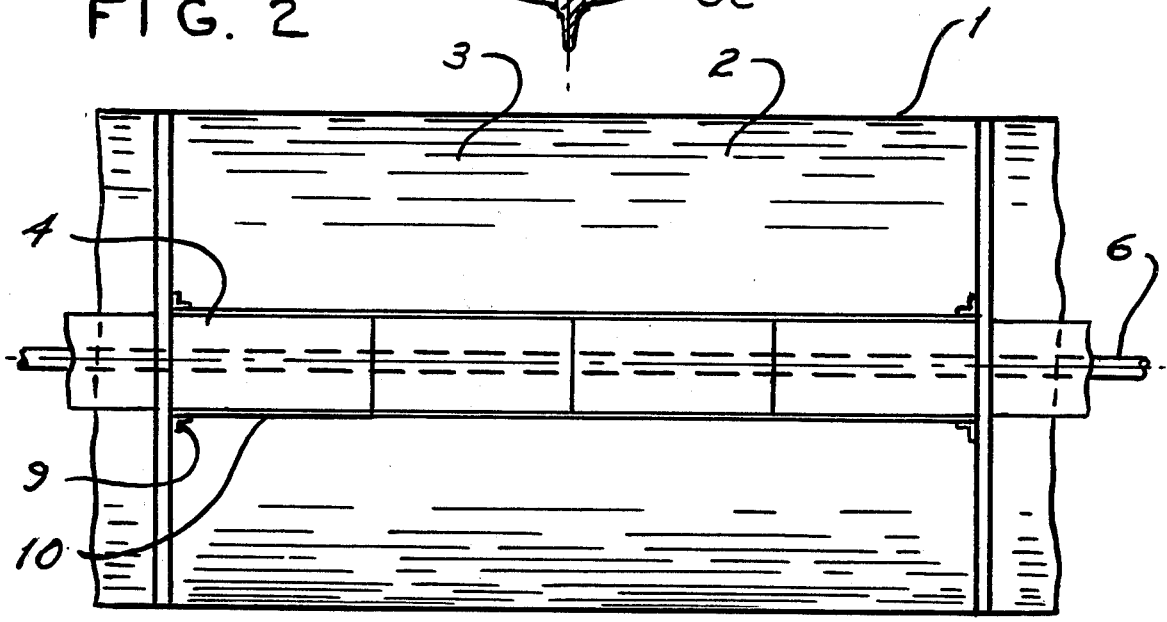
FIG. 2 is a partial planeview of the linear solar concentration panel.
Figure 3:
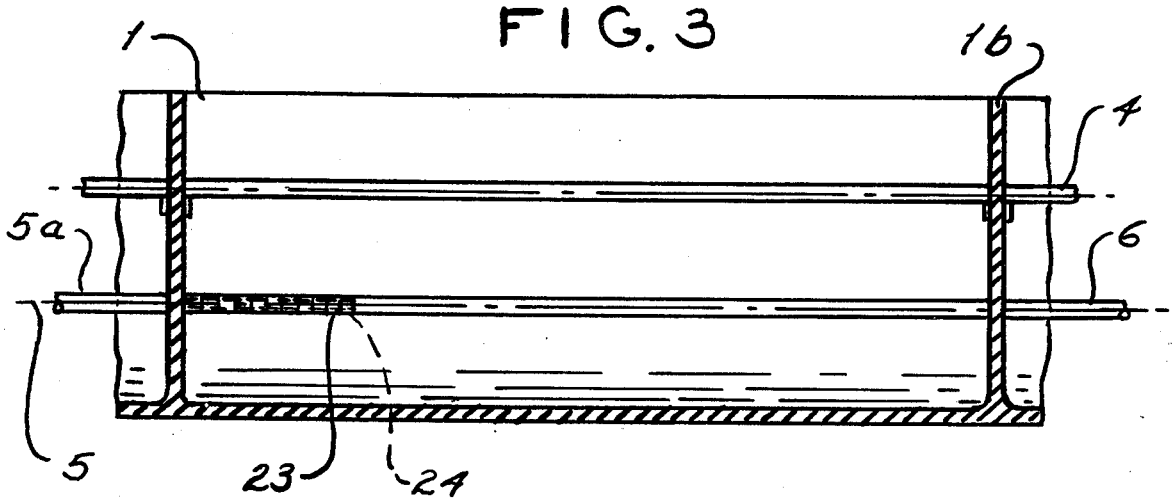
FIG. 3 is a partial elevation view of the linear solar concentration panel.
Figure 4:
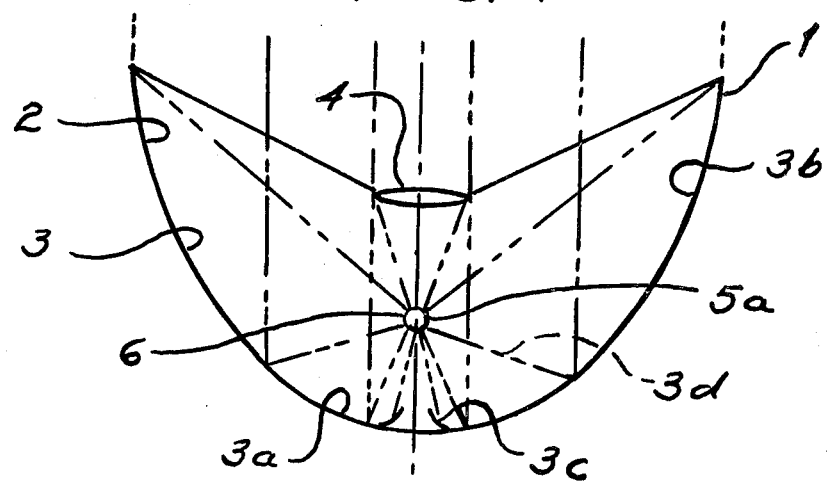
FIG. 4 is a schematic cross-section of a typical linear solar concentration panel.
Figure 5:
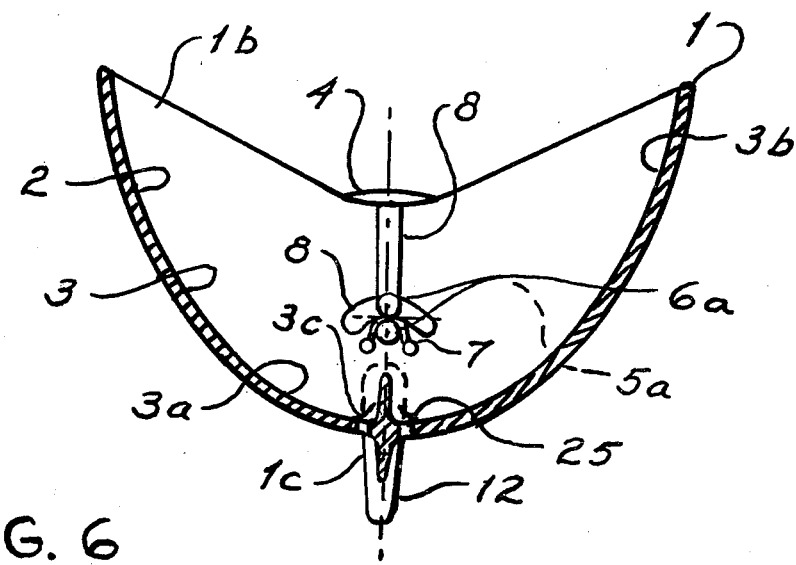
FIG. 5 is a cross-section view through an alternate bi-focal type of linear solar concentration panel.
Figure 6:
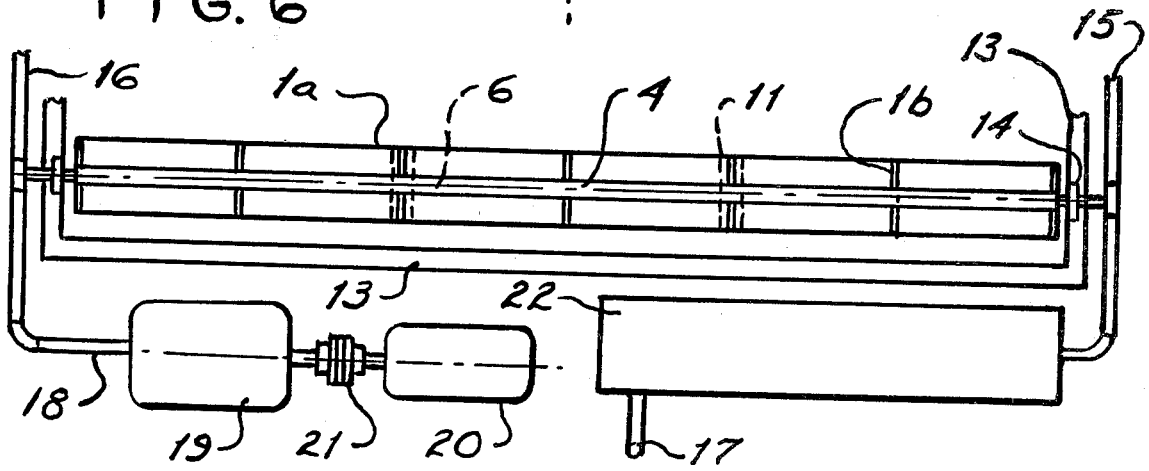
FIG. 6 is a plan view of one linear solar concentration panel with solar cells mounted onto the flash boiler pipe.

The dual conversion, steam and electric solar concentration system is comprised of the linear solar concentration panels, which have highly reflective mirror surfaces 2, on the full inner contoured surface 3.

The inner contoured surface 3, cross-section is comprised of three geometric shapes, a parabola 3a, which is symmetrical about the panel vertical centerline, and two equal and opposite radial curves 3b, which are smoothly blended the continuous contoured surface 3.

Two equal and opposite curved reflective strips 3c, are located near the lower panel centerline, which reflect the upper solar rays onto the underside of the focal zone, Solar ray coincident lines 3d, define the limits of the solar ray convergence from each section of the solar panel 1, Multiple top convex linear lenses 4, are located on the panel vertical centerline directly above the focal line 5, and focal zone 5a, A flash boiler pipe 6, supports the solar panels 1, with uniformly spaced formed wire loops 7, which are secured to rigid cross partitions 1b, which are an integral part of the solar panels 1.

Vertical slots 8, are symmetrically located on each rigid cross partition 1a, to accommodate the flash boiler pipes 6.

The multiple convex linear lenses 4, are supported by tracks 9, which are held in place on the cross partitions 1a, by the clips 10, and standard mounting hardware.

The linear solar concentration panels 1, are formed from several layers of fiberglass-epoxy resin to form a lightweight and durable structural memeber. The solar panel structure 1a, includes several longitudinal external ribs 1c, which contribute to the structural integrity of the solar panels 1.

Each short panel length section 1a, is joined together with formed metal slip on connectors 11, so that any total length of linear solar concentration panel 1, may be produced for each specific power installation.

A lower oscillating link 12, is secured to each end cross-partition 1b, for connection to a reciprocating rod, which is part of a sun-tracking mechanism-(not shown).

The flash boiler pipes 6, may be preassembled and supported by a lightweight framework 13, and mounting brackets 14, to save instllation time and labor.

Each of the multiple, parallel flash boiler pipes 6, is connected to a cold water header pipe 15 at one end, and to a steam header pipe 16, at the opposite end. The cold water header pipe 15, is connected to the cold water supply line 17, and the steam header pipe 16, is connected to the steam supply line 18, This steam supply line 18, is directly connected to a rotary steam engine 19, which is coupled with a 110 VAC alternator 20, by means by a flexible coupling 21.

The expended stream from the steam engine 19, is condensed and used as a hot water supply for household useage.

A water warming tank 22, may be utilized between the cold water supply line 17, and the cold water header pipe 15, to provide a pre-warmed water flow into the flash boiler pipes 6. This warmed water will hasten the generation of steam within the flash boiler pipes 6.

Multiple solar cells of the photovoltaic type 33, are arrayed in a square-form pattern around the flash boiler pipes 6, at the cold water entrance end of the solar panels 1, adjacent to the cold water supply line 17. The solar cells 23, are supported by the thin angle strips 24, which are held in place within the cross partitions 1b. Four thin angular strips are positioned between the cross partitions 1b, to mount the solar cells 23.

The number of solar cells 23, which are used in the system will be determined by the quantity cost breakdown point for these cells, and the cost-effective balance between the two solar conversion methods.

In an alternate design arrangement, bi-focal, dual-flash boiler pipes 6a, would be located on a central, vertical plane within the solar panels 1. The two equal and opposite radial reflectors 3b, are modified to provide uniform solar ray distribution over both focal zones 5a.

The dual flash boiler pipes 6a, make a 180 degrees loop at one end of the solar panels 1, so that the water inlet and steam outlet are at the same end of the solar panels 1.

Multiple solar photovoltaic cells are also mounted in a square-form pattern around the flash boiler pipes 6a, at the cold water entrance end of the flash boiler pipes 6a, and the previous mounting provisions are used for this system arrangement.

Multiple elongated slots 25, are located at the lower, centerline of the solar panels 1, for rain drainage and for some wind load relief.

What is claimed is:

1. A dual conversion stream and electric solar power system with linear solar concentration comprised of three geometric blended shapes,
   a base parabolic reflector section symmetrical about a vertical centerline,
   and blended with two equal and opposite side radial reflective, sections blended into the outer edges of said base parabolic reflector sections,
   two equal and opposite concave reflective elongate strips disposed adjacent to the bottom centerline of said linear solar concentrator panels,
   said linear solar concentration panels contructed of builtup fiberglass and epoxy resin to form a rigid structural member,
   highly reflective mirror surfaces bonded to the inner contoured surface of said linear solar concentration panels,
   multiple longitudinal ribs are external reinforcement for said linear solar concentration panels,
   multiple rigid cross partitions uniformly spaced within each of said linear solar concentration panels,
   multiple flash stream boiler pipes centrally and axially disposed at the focal zone within each of said linear solar concentration panels,
   vertical slots symmetrically disposed within the top of each of said multiple rigid cross partitions and in right-angle relationship to said multiple flash stream boiler pipes,
   multiple wire forms loops retaining said flash boiler pipes onto each of said multiple rigid cross partitions,
   fastening means for said multiple wire form loops onto said multiple rigid cross partitions,
   multiple linear convex lenses disposed between said multiple rigid cross partitions,
   metal tracks supporting said multiple linear convex lenses disposed between and supported by said multiple rigid cross partitions,
   said multiple linear convex lenses dispoed centrally above said flash stream boiler pipes,
   connection of one end of said multiple flash stream boiler pipes to a cold water header pipe, connection of the opposite end of said multiple flash stream boiler pipes to a steam header pipe,
   connection of said cold water header to a pressurized cold water supply source,
   connection of said stream header pipe to a steam engine-coupled to a 110 volt alternator,
   multiple solar photovoltaic cells arrayed in a square-form pattern around and in tangent contact with the top and bottom and side of said flash stream boiler pipes,
   said multiple solar photovoltaic cells disposed adjacent to the cold water entrance end of said flash stream boiler pipes, 2. A dual conversion stream and electric solar power system with liner solar conventration panels according to claim 1, in which the said solar panel width to flash stream boiler pipes diameter ratio is between 2:1 and 28:1, the solar concentration ratio is between 30:1 and 35:1, the solar panel width to vertical focal line distance ratio is between 1.32:1 and 1.98:1, the distance between top of the solar panel to the central focal line three times + (plus) or − (minus) 0.07 the panel width with the radius centered on a horizontal line which is 0.671 + (plus) or − (minus) 0.07 above the focal line in the cross-section view,
   said multiple linear convex lenses have a maximum width of flash steam boiler pipe diameter of 6:1.

3. A dual conversion steam and electric solar power system with linear solar concentration panels according to claim 1, in which the converging solar rays from said base parabolic reflective section are focused on the underside width of said flash steam boiler pipes at the focal zone,
   the converging solar rays from the lower portion of said two equal and opposite radial reflective sections are focused on both sides heights of said flash steam boiler pipes at the focal zone,
   the converging solar rays from the upper portion of said two equal and opposite radial reflective sections are reflected down along the inner concave solar panel surface to two equal and opposite short height concave reflective strips adjacent to the bottom panel centerline,
   the converting solar rays from the multiple linear convex lenses are uniformly focused on the top width of said flash steam boiler pipes at the focal zone,
   said flash steam boiler pipes are centrally disposed at the focal zone of the said geometric blended shapes,
   and one linear convex lens section of said linear solar concentration panel.

4. A dual conversion steam and electric solar power system with linear solar concentration panels according to claim 1, in which said multiple solar photovoltaic cells located adjacent to said cold water entrance extend for a maximum of one-third the length of said linear solar concentration panels, a solar water warming tank is disposed between said pressurized cold water supply source and said cold water header pipe, two lower oscillating links are secured at opposite ends of said linear solar concentration panels, multiple elongate open slots are symmetrically disposed at the bottom solar panel centerline between said rigid cross partitions.

5. A dual conversion steam and electric solar power system with linear solar concentration panels according to claim 1, in which said highly reflective mirror surfaces are made up of multiple narrow mirror segments uniformly bonded onto said inner contured surface of said linear solar concentration panels, said highly reflective mirror surfaces made up of multiple narrow mirror segments are lined up in uniform right angle rows and columns within said inner contoured surface, said highly reflective mirror surfaces may be comprised of thin highly polished continuous reflective metallic foil.

6. A dual conversion steam and electric solar power system with linear solar concentration panels comprised of three blended geometric cross-sections, a base parabolic reflective section symmetrical about a vertical centerline and blended with, two equal and opposite side radial reflective sections at the outer edges of said base parabolic reflective section, two equal and opposite concave reflective short height strips disposed adjacent to the lower centerline of said linear solar concentration panels, multiple elongate open slots symmetrically disposed about the bottom centerline of said linear solar concentration panels, said linear solar concentration panels constructed of builtup fiberglass and epoxy resin to form a symmetrical deep concave structural member, highly reflective mirror-like surfaces bonded to the inner contoured surfaces of said linear solar concentration panel, multiple longitudinal ribs added as external reinforcements for said linear solar concentration panels, multiple rigid cross partitions uniformly spaced within said linear solar concentration panels, vertical slots symmetrically disposed within the top of each of said rigid cross partitions, multiple flash steam boiler pipes centrally and axially disposed within each of said linear solar concentration panels, said multiple flash steam boiler pipes are disposed in two levels within a central vertical plane at the focal zone with each of said linear solar concentration panels, a 180 degree connection of said two levels of multiple flash steam boiler pipes at one end of said linear solar concentration panels, radial clearance slots disposed within each of said multiple rigid cross partitions for cleaning one of said two multiple flash steam boiler pipes, multiple wire form loops retaining one of said two multiple flash steam boiler pipes onto each of said multiple rigid cross partitions, multiple linear convex lenses disposed between said multiple rigid cross partitions, metal tracks supporting said multiple linear convex lenses disposed between and supported by said multiple rigid cross partitions, said multiple linear convex lenses disposed centrally about said flash steam boiler pipes within the focal zone, connection of one end of said multiple flash steam boiler pipes to a cold water header pipe, connection of the other end of said multiple flash steam boiler pipe at the same panel end to a steam header pipe, connection of said cold water header to a pressurized cold water supply pipe, connection of said steam header pipe to a rotary steam engine coupled to a 110 volt alternator, multiple solar photovoltaic cells arrayed in a square-form pattern around and tangent to the top and bottom and sides of one of said multiple flash steam boiler pipes, said multiple solar photovoltaic cells disposed adjacent to the cold water entrance end of said multiple flash steam boiler pipes.

7. A dual conversion steam and electric solar power system with linear solar concentration panels according to claim 6, in which the panel width to focal zone width ratio is near a maximum of 28:1, the solar concentration ratio is at a maximum of 35:1, the solar panel width to vertical focal line distance is 1.32:1, the distance from the top of the solar panel to the central focal line is four times + (plus) or − (minus) 0.1 the panel width with the radius centered on a horizontal line which is 0.75=(equal) or −0.1 above the focal line in the cross-section view, said multiple linear convex lenses have a maximum width to flash steam boiler pipe diameter of 8:1.

8. A dual conversion steam and electric solar power system with linear solar concentration panels according to claim 6, in which said multiple solar photovoltaic cells disposed adjacent to the cold water entrance extend for a maximum distance of one-half the length of said linear solar concentration panels, a solar water warming tank disposed between said pressurized cold water supply and said cold water header pipe is added, two lower oscillating links secured at opposite ends of said linear solar concentration panels are added, 9. A dual conversion steam and electric solar power system with linear solar concentration panels according to claim 6, in which said highly reflective mirror surfaces are made up of multiple narrow mirror segments bonded to said linear contoured surfaces of said linear solar concentration panels, said highly reflective mirror surfaces made up of multiple narrow mirror segments are lined up in uniform right angle rows and columns within said inner contoured surfaces, said highly reflective mirror surfaces may be comprised of thin highly reflective polished continuous reflective metal sheet.

10. A dual conversion steam and electric solar power system with linear solar concentration panels according to claim 6, in which the converging solar rays from said base parabolic section are focused on the underside width of the lowest of said flash steam boiler pipes, the converging solar rays from the lower portion of said two equal and opposite radial reflective sections are focused on the sides of both said flash steam boiler pipes of the dual focal zones, the converging solar rays from the upper portion of said two equal and opposite radial reflective sections are reflected down along the inner concave solar panel surface at two equal and opposite short height concave reflective strips adjacent to the bottom panel centerline, the converging solar rays from the multiple linear convex lenses are uniformly focused on the top width of said flash steam boiler pipes at the upper focal zone, said flash steam boiler pipes disposed in two levels at the dual focal zone of the said three blended geometric cross-sections, and one linear convex lens section of said linear solar concentration panels.

* * * * *